United States Patent
Nagatsu

(10) Patent No.: US 11,177,119 B2
(45) Date of Patent: Nov. 16, 2021

(54) TANTALUM SPUTTERING TARGET

(71) Applicant: JX Nippon Mining & Metals Corporation, Tokyo (JP)

(72) Inventor: Kotaro Nagatsu, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 75 days.

(21) Appl. No.: 16/308,974

(22) PCT Filed: Jan. 24, 2018

(86) PCT No.: PCT/JP2018/002154
§ 371 (c)(1),
(2) Date: Dec. 11, 2018

(87) PCT Pub. No.: WO2018/179742
PCT Pub. Date: Oct. 4, 2018

(65) Prior Publication Data
US 2020/0131622 A1   Apr. 30, 2020

(30) Foreign Application Priority Data
Mar. 30, 2017   (JP) .............................. JP2017-068489

(51) Int. Cl.
*H01J 37/34*   (2006.01)
*C23C 14/34*   (2006.01)
(Continued)

(52) U.S. Cl.
CPC .......... *H01J 37/3426* (2013.01); *C22C 27/02* (2013.01); *C22C 45/10* (2013.01); *C23C 14/3414* (2013.01)

(58) Field of Classification Search
CPC .. H01J 37/3426; C23C 14/3414; C22C 22/07; C22C 45/10; C22C 27/02
See application file for complete search history.

(56) References Cited

U.S. PATENT DOCUMENTS

| | | | |
|---|---|---|---|
| 6,462,339 B1 | 10/2002 | Michaluk et al. | |
| 7,892,367 B2 * | 2/2011 | Oda | ..................... C23C 14/3414 148/422 |

(Continued)

FOREIGN PATENT DOCUMENTS

| | | |
|---|---|---|
| CN | 1476533 A | 2/2004 |
| EP | 0902102 A1 | 3/1999 |

(Continued)

OTHER PUBLICATIONS

International Preliminary Report on Patentability dated Oct. 10, 2019 in corresponding PCT application No. PCT/JP2018/002154.

(Continued)

*Primary Examiner* — Michael A Band
(74) *Attorney, Agent, or Firm* — Nields, Lemack & Frame, LLC

(57) ABSTRACT

Provided is a tantalum sputtering target that contributes to improvement of film thickness uniformity during a high-power sputtering. A tantalum sputtering target having a purity of 99.99% by mass or more and an average value of Vickers hardness on a sputtering surface of from 85 to 110 Hv, the tantalum sputtering target satisfying both of the following conditions (1) and (2):
(1) when a cross section perpendicular to the sputtering surface is measured by EBSP, an average value of Kernel Average Misorientation values (KAM values) is from 0.2° to 2.8°; and
(2) when a cross section perpendicular to the sputtering surface is measured by EBSP, an average value of orientation area ratios of a {100} plane oriented at a misorientation of within 15° relative to a normal direction of the sputtering surface is 20% or more.

6 Claims, 2 Drawing Sheets

(51) Int. Cl.
  *C22C 27/02* (2006.01)
  *C22C 45/10* (2006.01)

(56) References Cited

U.S. PATENT DOCUMENTS

| | | | |
|---|---|---|---|
| 8,747,633 B2* | 6/2014 | Nakashima | C22F 1/18 204/298.13 |
| 10,658,163 B2* | 5/2020 | Nagatsu | H01J 37/3426 |
| 2003/0168131 A1 | 9/2003 | Michaluk et al. | |
| 2005/0268999 A1 | 12/2005 | Oda | |
| 2007/0023281 A1 | 2/2007 | Oda | |
| 2007/0062807 A1 | 3/2007 | Oda | |
| 2007/0102288 A1 | 5/2007 | Oda et al. | |
| 2009/0032392 A1 | 2/2009 | Miyashita | |
| 2011/0297536 A1 | 12/2011 | Wickersham et al. | |
| 2012/0297855 A1 | 11/2012 | Matera et al. | |
| 2017/0372879 A1 | 12/2017 | Nagatsu et al. | |
| 2018/0237901 A1 | 8/2018 | Mori et al. | |

FOREIGN PATENT DOCUMENTS

| | | | | |
|---|---|---|---|---|
| EP | 3211118 A1 | 8/2017 | | |
| JP | 11-80942 A | 3/1999 | | |
| JP | 2001-295035 A | 10/2001 | | |
| JP | 2002-530534 A | 9/2002 | | |
| JP | 2002-363736 A | 12/2002 | | |
| JP | 2003-166053 A | 6/2003 | | |
| JP | 2004-107758 A | 4/2004 | | |
| JP | 2004-162117 A | 6/2004 | | |
| JP | 3898043 B2 | 3/2007 | | |
| JP | 2007-536431 A | 12/2007 | | |
| JP | 2008-532765 A | 8/2008 | | |
| JP | 5076137 B2 | 11/2012 | | |
| WO | 2004/090193 A1 | 10/2004 | | |
| WO | 2005/045090 A1 | 5/2005 | | |
| WO | WO-2005045090 A1 * | 5/2005 | ......... | C23C 14/3414 |
| WO | 2006/117949 A1 | 11/2006 | | |
| WO | 2016/190160 A1 | 12/2016 | | |
| WO | 2017/033694 A1 | 3/2017 | | |

OTHER PUBLICATIONS

International Search Report dated Mar. 13, 2018 in corresponding PCT application No. PCT/JP2018/002154.

* cited by examiner

[FIG. 1]
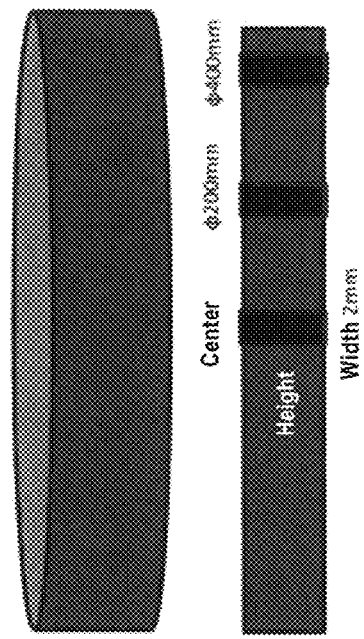
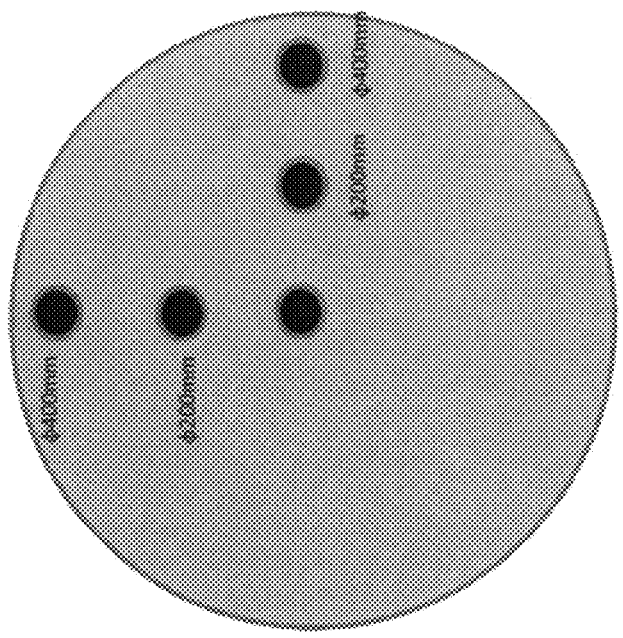

[FIG. 2]
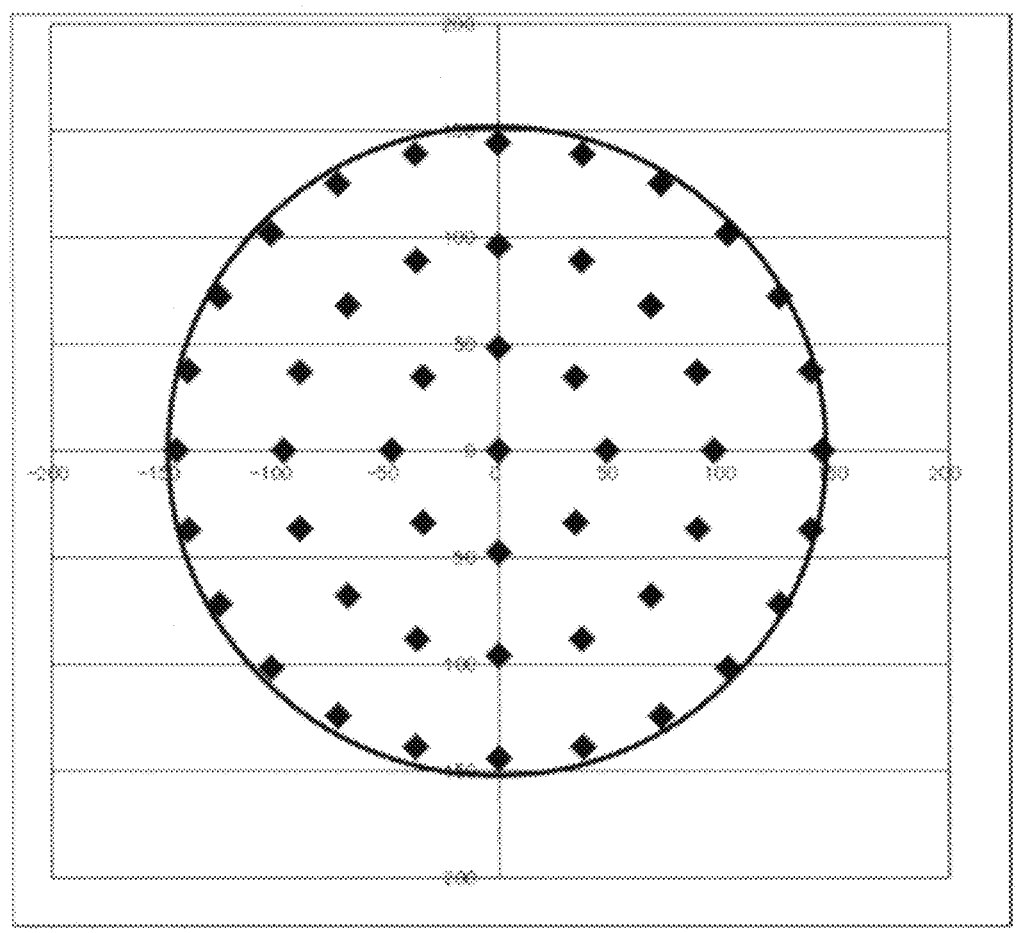

TANTALUM SPUTTERING TARGET

TECHNICAL FIELD

The present invention relates to a tantalum sputtering target.

BACKGROUND ART

In many fields such as an electronics field, a corrosion-resistant material and decoration fields, a catalyst field, and production of cutting/abrasive materials and wear-resistant materials, a sputtering method for forming a film of a metal or a ceramics material or the like is employed. The sputtering method itself is well known in the above fields. Recently, the electronics field particularly requires a tantalum sputtering target suitable for forming a coated film having a complex shape and forming a circuit, in particular for forming a barrier seed layer that covers wires for a semiconductor integrated circuit.

Recently, high power sputtering using a magnetron sputtering apparatus is performed in order to increase a film deposition rate of sputtering. However, the high power sputtering is difficult to control the direction of substance emitted from a target, and is also difficult to uniformly deposit a sputtering substance onto a wafer surface as the wires of the semiconductor integrated circuit is increasingly miniaturized. The problems are remarkable particularly when embedding is carried out in a wire hole having a large aspect ratio. The requirement also has become severe for a tantalum sputtering target used as a barrier seed layer material for Cu wiring, and it is thus necessary to be able to form a stable ultrathin film by controlling a sputtering rate, in order to form a highly reliable film in the narrow wire hole having the large aspect ratio. In particular, there is a need for providing high film thickness uniformity when sputtering the tantalum sputtering target.

Measures for improving characteristics of tantalum sputtering targets, which have been proposed, are illustrated below:

- a crystalline structure in which the (222) orientation is preferential is provided from a position of 30% of the target thickness or a position of 20% of the target thickness or a position of 10% of the target thickness toward a center plane of a tantalum target, and is formed in a disc shape (a convex lens shape) at the center portion of the target (Patent Document 1);
- an X-ray diffraction intensity ratio of a {110} plane is controlled to 0.4 or less (Patent Document 2);
- refinement and homogenization of crystal grains (Patent Documents 3 and 4);
- an in-plane variation of the sum of area ratios on a sputtering surface of three planes {110}, {200}, and {211} with high atomic density is set to be within ±20% (Patent Document 3);
- a tantalum ingot or billet is molten and cast, followed by forging, annealing and plastic working such as rolling to form a tantalum target having a non-recrystallized structure (Patent Document 5);
- a crystal orientation is set to be random, and an area ratio of crystals having any orientation of (100), (111) and (110) does not exceed 0.5 (Patent Document 6);
- refinement of an aggregate structure (Patent Documents 7 and 9);
- a step of rotary axial forging of a provisional formed body derived from an ingot to the shape and size of a sputtering target is carried out (Patent Document 8);
- a variation of an intensity ratio: (110)/{(110)+(200)+(211)+(220)+(310)} determined by X-ray diffraction of a crystal plane to be sputtered, depending on positions of a sputtered surface portion, is suppressed within 20% (Patent Document 10);
- an average crystal grain diameter of a sputtered surface is 300 µm or less and a variation of the average crystal grain diameter depending on positions of the sputtered surface is controlled within 20% (Patent Document 10);
- generation of bubbles in crystal grains of a target structure is suppressed (Patent Document 11);
- highly purifying (Patent Documents 9 and 12);
- a fine grain structure and/or uniform aggregate structure is/are formed (Patent Documents 9 and 12); and
- control of Vickers hardness (Patent Documents 5 and 13).

CITATION LIST

Patent Literatures

Patent Document 1: Japanese Patent Application Publication No. 2004-107758 A
Patent Document 2: WO 2006/117949
Patent Document 3: Japanese Patent Application Publication No. H11-80942 A
Patent Document 4: Japanese Patent Application Publication No. 2004-162117 A
Patent Document 5: WO 2004/090193
Patent Document 6: WO 2005/045090
Patent Document 7: Japanese Patent Application Publication No. 2008-532765 A
Patent Document 8: Japanese Patent Application Publication No. 2007-536431 A
Patent Document 9: Japanese Patent Application Publication No. 2002-530534 A
Patent Document 10: Japanese Patent Application Publication No. 2002-363736 A
Patent Document 11: Japanese Patent Application Publication No. 2001-295035 A
Patent Document 12: Japanese Patent No. 5076137 B
Patent Document 13: Japanese Patent No. 3898043 B

SUMMARY OF INVENTION

Technical Problem

As described above, various improvements of the characteristics of the tantalum sputtering target have been proposed. However, as the semiconductor integrated circuit has been miniaturized, the requirement level for the film thickness uniformity has also been continued to increase. In particular, it will be advantageous for manufacturing the most advanced fine wiring patterns with high production efficiency, if a high-power sputtering can be carried out with high film thickness uniformity. It is therefore an object of the present invention to provide a tantalum sputtering target that contributes to improvement of the film thickness uniformity during a high-power sputtering.

Solution to Problem

The present inventor intensively studied in order to solve the above problems, and found that in the conventional tantalum sputtering target, the film deposition rate under a high-power sputtering is too high, and the film thickness uniformity when forming a barrier seed layer corresponding to the most advanced fine Cu wiring pattern cannot be sufficiently obtained. Therefore, the present inventor focused on suppression of the film deposition rate and investigated characteristics of the tantalum sputtering target which will be effective for improving the film thickness uniformity when carrying out the high-power sputtering. As a result of trial and error, the present inventor has found that the film deposition rate during the high-power sputtering is appropriately suppressed by controlling a strain amount and crystal orientations, thereby improving the film thickness uniformity.

The present invention has been accomplished based on the above findings. In one aspect, the present invention provides a tantalum sputtering target having a purity of 99.99% by mass or more and an average value of Vickers hardness on a sputtering surface of from 85 to 110 Hv, the tantalum sputtering target satisfying both of the following conditions (1) and (2):

(1) when a cross section perpendicular to the sputtering surface is measured by EBSP, an average value of Kernel Average Misorientation values (KAM values) is from 0.2° to 2.8°; and
(2) when a cross section perpendicular to the sputtering surface is measured by EBSP, an average value of orientation area ratios of a {100} plane oriented at a misorientation of within 15° relative to the normal direction of the sputtering surface is 20% or more.

In one embodiment of the tantalum sputtering target according to the present invention, the tantalum sputtering target has an average value of aspect ratios of crystal grains of 2.0 or more, as observed in a cross section perpendicular to the sputtering surface.

In another embodiment of the tantalum sputtering target according to the present invention, the average value of the Kernel average misorientation values (KAM values) is from 1.0° to 2.5°.

In another embodiment of the tantalum sputtering target according to the present invention, when the cross section perpendicular to the sputtering surface is measured by EBSP, the average value of the orientation area ratios of the {100} plane oriented at a misorientation of within 15° relative to the normal direction of the sputtering surface is 30% or more.

Another aspect of the present invention provides a method for forming a film comprising sputtering the tantalum sputtering target according to the present invention.

Advantageous Effects of Invention

The use of the tantalum sputtering target according to the present invention can allow improvement of film thickness uniformity during a high-power sputtering. Therefore, the tantalum sputtering target according to the present invention is particularly advantageous for application of forming a barrier seed layer corresponding to a fine Cu wiring pattern.

BRIEF DESCRIPTION OF DRAWINGS

FIG. 1 is a view showing observation positions of a structure of a sputtering target for measuring an orientation area ratio of a {100} plane.

FIG. 2 is a view showing measurement points of sheet resistance for a film formed onto a wafer.

DESCRIPTION OF THE PREFERRED EMBODIMENTS

Hereinafter, embodiments of the present invention will be described in detail.

(1) Purity

Since impurities in a tantalum sputtering target cause deterioration of device characteristics in a semiconductor integrated circuit, it is preferable that the tantalum sputtering target has purity as high as possible. Therefore, the tantalum sputtering target according to the present invention preferably has a purity of 99.99% by mass or more (4 N or more), and more preferably 99.995% by mass or more. By way of example, the purity of the tantalum sputtering target according to the present invention may be from 99.99% by mass to 99.9999% by mass. As used herein, the purity of 99.99% by mass or more means that the total value of Na, Al, Si, K, Ti, Cr, Mn, Fe, Co, Ni, Cu, Zn and Zr is 100 ppm by mass or less when a compositional analysis is conducted by means of glow discharge mass spectrometry (GDMS).

(2) Vickers Hardness (Hv)

The film thickness uniformity can be improved by controlling Vickers hardness of the tantalum sputtering target within a predetermined range while controlling a KAM value and an orientation area ratio of a {100} plane, which will be described below. Even if only the Vickers hardness is controlled, substantially no effect of improving the film thickness uniformity is observed. The combination of the control of the Vickers hardness with appropriate control of the KAM value and the orientation area ratio of the {100} plane allows significant improvement of the film thickness uniformity.

More particularly, the average value of the Vickers hardness of the sputtering surface of the tantalum sputtering target may preferably be 85 Hv or more, and more preferably 90 Hv or more. The average value of the Vickers hardness of the sputtering surface of the tantalum sputtering target may preferably be 110 Hv or less, and more preferably 105 Hv or less. While not wishing to be bound by any theory, it is believed that when the average value of the Vickers hardness of the sputtering surface of the tantalum sputtering target is within the above range, appropriate strain remains inside the target, which suppresses the film deposition rate during the high-power sputtering.

In the present invention, the Vickers hardness of the sputtering surface (that is, the main surface to be sputtered) of the tantalum sputtering target can be measured in accordance with JIS Z2244:2009. When determining the average value of the Vickers hardness, five or more positions should be measured while paying attention not to bias the measurement points from the center portion to the peripheral portion of the sputtering surface.

(3) Kernel Average Misorientation (KAM Value)

The KAM (Kernel Average Misorientation) value represents a misorientation between adjacent measurement points within a crystal grain, and can be determined by measuring a misorientation within the crystal grain by crystal orientation analysis in EBSP (Electron Back Scattering Pattern) measurement, using analytical software attached to an EBSP apparatus. According to results of investigation by the present inventor, an increasing KAM value to a certain extent contributes to the film thickness uniformity, but the film thickness uniformity is sharply deteriorated from a certain value.

More particularly, the film thickness uniformity is significantly improved by controlling the average value of the KAM values to 0.2° to 2.8°. The average value of the KAM values may preferably be 0.5° or more, and more preferably 1.0° or more, and even more preferably 1.5° or more. The average value of the KAM values may preferably be 2.5° or less. While not wishing to be bound by any theory, it is believed that the reason why the film thickness uniformity is improved by controlling the KAM value is that a penetration depth of Ar ions colliding with the target during the sputtering becomes small, whereby sputtering rate is decreased.

In the present invention, the KAM value of the tantalum sputtering target can be determined under the following measurement conditions. The KAM values at 5 or more observation fields of view are measured while paying attention so as not to bias the measurement points, and the average value thereof are determined to be a measurement value.

(a) SEM Condition
Beam Condition: acceleration voltage of 15 kV, irradiation current of 60 μA;
Work Distance: 20 mm;
Observation Surface: a cross section perpendicular to the sputtering surface (a cross section parallel to the thickness direction);
Size of One Observation Field of View:
a length in a direction parallel to the sputtering surface (a width direction)=2 mm;
a length in a direction perpendicular to the sputtering surface (a thickness direction)=entire thickness;
Pretreatment of Observation Surface: the surface is polished with abrasive paper (corresponding to #2000), further mirror-finished by buff polishing using a polishing solution, and the resulting polished surface is treated with a mixed solution of hydrofluoric acid, nitric acid and hydrochloric acid to reveal a structure.

(B) EBSP Condition
Measurement Program: OIM Data Collection;
Data Analysis Program: OIM Analysis;
Step Width: 20 μm;
Measurement of misorientation of 0 to 5° (if the misorientations are 5° or more, all of them are treated as 5°).

(4) Orientation Area Ratio of {100} Plane

In order to improve the film thickness uniformity, it is also important that when a cross section perpendicular to the sputtering surface of the tantalum sputtering target is observed, the proportion of crystal grains whose {100} plane is oriented in the normal direction of the sputtering surface is high. More particularly, when the cross section perpendicular to the sputtering surface is measured by EBSP, the average value of the orientation area ratios of the {100} plane oriented at a misorientation of within 15° relative to the normal direction of the sputtering surface is preferably 20% or more, and more preferably 25% or more, and still more preferably 30% or more. While not wishing to be bound by any theory, the reason why the film thickness uniformity is improved by controlling the orientation area ratio of the {100} plane is presumed as follows. In the tantalum having a body-centered cubic structure, the close-packed orientation of atoms is <111>, and the relationship between the sputtering surface and the close-packed orientation is important for controlling the film deposition rate. When the {100} plane is oriented in the normal direction (ND) of the rolling surface, the angle of the close-packed orientation relative to the normal direction of the sputtering surface becomes increased (widely angled), so that sites where the film becomes partially thick in the wafer surface are decreased, whereby a thin film with good film thickness uniformity can be formed. However, according to results of investigation by the present inventor, an increasing orientation area ratio of the {100} plane contributes to the film thickness uniformity, but when the orientation area ratio exceeds about 40%, the crystal grains collapse and their shapes cannot be maintained, so that the film thickness uniformity is sharply deteriorated. Therefore, the orientation area ratio of the {100} plane is preferably 40% or less.

In the present invention, the orientation area ratio of the {100} plane of the tantalum sputtering target can be determined under the following measurement conditions. The orientation area ratios of the {100} plane are measured at 5 or more observation fields of view while paying attention so as not to bias the measurement points, and the average value thereof is determined to be a measurement value.

(a) SEM Condition
Beam Condition: acceleration voltage of 15 kV, irradiation current of 60 μA;
Work Distance: 20 mm;
Observation Surface: a cross section perpendicular to the sputtering surface (a cross section parallel to the thickness direction);
Size of One Observation Field:
a length in a direction parallel to the sputtering surface (a width direction)=2 mm;
a length in a direction perpendicular to the sputtering surface (a thickness direction)=entire thickness;
Pretreatment of Observation Surface: the surface is polished with abrasive paper (corresponding to #2000), further mirror-finished by buff polishing using the polishing solution, and the resulting polished surface is treated with a mixed solution of hydrofluoric acid, nitric acid and hydrochloric acid to reveal a structure.

(B) EBSP Condition
Measurement Program: OIM Data Collection;
Data Analysis Program: OIM Analysis;
Step Width: 20 μm.

(5) Aspect Ratio

In order to improve the film thickness uniformity, an average value of aspect ratios of crystal grains observed in a cross section perpendicular to the sputtering surface is preferably 2.0 or more. Here, the aspect ratio of the crystal grain refers to a ratio of the length of the crystal grain in the in-plane direction (the direction parallel to the sputtering surface) to the length of the crystal grain in the plate thickness direction (the direction perpendicular to the sputtering surface), for each crystal grain. The length of each crystal grain in the plate thickness direction is defined as the maximum value of the length of each crystal grain in the plate thickness direction, when observing the cross section. The length of each crystal grain in the in-plane direction is defined as the maximum value of the length of each crystal grain in the in-plane direction, when observing the cross section. Therefore, the aspect ratio of the crystal grain of 2.0 or more means that the crystal grain has a crushed shape in the thickness direction (the normal direction of the sputtering surface) and relatively larger strain is generated in the crystal grain. While not wishing to be bound by any theory, it is believed that the strain contributes to suppression of the film deposition rate during the high-power sputtering.

The average value of the aspect ratios of the crystal grains may preferably be 2.0 or more, and more preferably 2.5 or more, and still more preferably 2.8 or more. However, the average value of the aspect ratios of the crystal grains may preferably be 3.5 or less, more preferably 3.2 or less, because an excessively increased average value of the aspect ratios of the crystal grains may decrease the film thickness uniformity.

In the present invention, the aspect ratio of crystal grain is measured by the following procedure. The aspect ratios of 20 or more crystal grains are measured while paying attention so as not to bias the measurement points, and the average value thereof is determined to be a measured value.

Observation of the cross section is conducted with a magnification of 100 by means of an optical microscope after the cross section is mirror-finished.

(6) Producing Method

The tantalum sputtering target according to the present invention can illustratively be produced by the following procedure. First, a high purity tantalum raw material, for example, a tantalum raw material having a purity of 99.99% by mass or more (4 N or more) is prepared, and it is melted and cast to prepare an ingot. The ingot is then subjected to cold press forging to form a billet, which is cut into an appropriate size and then subjected to a heat treatment (preferably at 750 to 1300° C.). Further, the cut billet is subjected to a primary cold forging and a primary heat treatment (preferably at 750 to 1300° C.) in this order, followed by a secondary cold forging. The billet is then split into two parts and then subjected to a secondary heat treatment (preferably at 950 to 1100° C.). The present invention is not limited to the steps as described above, and the number of forging and the temperatures of heat treatments can be appropriately selected in order to adjust the forged structure.

The billet is then subjected to: 1) two or more consecutive rolling in one direction, 2) 90° rotating and further two or more consecutive cold rolling, and two or more sets of these steps are repeated, such as 1)→2)→1)→2)→ and so on, to obtain a predetermined plate thickness. As used herein, the run of one set of 1) and 2) is referred to as one set of cross rolling. The cold rolling is carried out such that the structure orientation is controlled at a rolling reduction per one pass of 12% or less and the total rolling reduction is adjusted at 85% or more. The number of one pass of the cold rolling during this intermediate stage significantly contributes to the control of orientation, and the larger number of passes can increase the orientation area ratio of the {100} plane.

This rolled product is subjected to a heat treatment, preferably a heat treatment at 750 to 1000° C. for 1 hour or more, for the purpose of recrystallization, and finally subjected to cold rolling. In order to introduce moderate strain, the final cold rolling is preferably carried out under the condition that two or more sets of cross rolling are carried out at a rolling reduction of 3% or less per one pass, and more preferably under the condition that four or more sets of cross rolling is carried out at a rolling reduction of 3% or less per one pass, and still more preferably under the condition that six or more set of cross rolling is carried out at a rolling reduction of 3% or less per one pass. The setting of rolling reduction per pass in the final cold rolling to the low value and an increase in the number of passes are advantageous for increasing the orientation area ratio of the {100} plane, and they provide an advantage that uniform strain can be introduced. The final cold rolling can result in an increased Vickers hardness and an increased aspect ratio of the crystal grain. Also, the KAM value can be increased by increasing the rolling reduction of the final rolling. This makes it possible to effectively provide a uniform and fine structure due to destruction of the forged structure and rolling.

The rolled product is then machined into a desired shape (a disc shape, a rectangular shape, a polygonal shape, a cylindrical shape, or the like) to form a sputtering target. When produced by rolling, the rolled surface generally becomes the sputtering surface. For the crystal aggregate structure in the sputtering target formed by the rolling processing and the heat treatment, preferential plane orientation is figured out by the EBSP method, and the results are fed back to the conditions of the rolling processing and the heat treatment, whereby the desired structure orientation can be obtained. The sputtering target may be used alone or may be used by being bonded to a backing plate as needed.

EXAMPLES

Hereinafter, Examples for better understanding of the present invention and its advantages will be illustrated, but the present invention should not be limited to the Examples.

Example 1

A tantalum raw material having a purity of 99.997% by mass was melted by electron beam and cast to prepare an ingot having a length of 1000 mm and a diameter of φ195 mm. This ingot was then subjected to cold press forging to have a diameter of φ150 mm, and then cut at a required length to obtain a billet. The billet was then subjected to a heat treatment at a temperature of 1250° C., followed by a primary cold forging, a heat treatment at 1000° C., and a secondary cold forging. The billet was then split into two parts and subjected to a heat treatment at 1000° C. again.

The forged billet was then subjected to cold cross rolling. The cross rolling was carried out by repeating a total 10 sets of cross rolling at a rolling reduction of less than 12% per one pass and then performing cold rolling with a reduction ratio of less than 10% per rolling pass. The rolled material after the cold rolling was subjected to a heat treatment at 800° C. The resulting target material having a thickness of 10 mm and φ500 mm was then subjected to finishing machining to produce a disc-shaped tantalum sputtering target having a thickness of 6.35 mm and φ450 mm. Multiple sputtering targets were prepared for various characteristic tests.

Examples 2 to 7

Disc-shaped tantalum sputtering targets each having a thickness of 6.35 mm and φ450 mm were produced in the same procedure as that of Example 1, with the exception that a final cold rolling was carried out between the heat treatment at 800° C. and the finishing machining under the conditions of the total rolling reduction and the rolling reduction per one pass as shown in Table 1. It should be noted that the final pass during the final cold rolling was smaller than the one pass condition shown in Table 1, because fractions were adjusted in the final pass.

(Purity)

The tantalum sputtering targets of the respective test examples obtained by the above producing method were sampled and subjected to compositional analysis by means of glow discharge mass spectrometry (GDMS), demonstrating that all the tantalum sputtering targets according to the test examples had a purity of 99.995 by mass or more.

(Average Value of Vickers Hardness)

For the tantalum sputtering target of each test example obtained by the above producing method, the Vickers hardness of the sputtering surface was determined in accordance with JIS Z2244:2009 using a model MMT-X7 manufactured by MATSUZAWA CORPORATION, under a measurement condition of a load of 200 kg. Measurement of the Vickers hardness was conducted for each target at five positions at equal intervals in the radial direction from the center portion to the peripheral portion of the sputtering surface, and the average value thereof was determined to be a measured value. The results are shown in Table 1.

(Average Value of KAM Values)

The tantalum sputtering target of each test example obtained by the above producing method was cut in a direction perpendicular to the sputtering surface, and its cross section was polished with abrasive paper (corresponding to #2000) and further mirror-finished by means of buff polishing using a polishing solution (available from Fujimi Incorporated, POLIPLA #700) (hereinafter referred to as "POLIPLA solution"). The resulting polished surface was treated with a mixed solution of hydrofluoric acid, nitric acid and hydrochloric acid to reveal a structure of a cross section perpendicular to the sputtering surface. The cross section perpendicular to the sputtering surface (width direction: 2 mm, thickness direction: overall thickness) was observed under the measurement conditions as described above using an EBSP apparatus (JSM-7001FT TLS type field emission electron microscope/crystal orientation analyzing apparatus OIM 6.0-CCD/BS), and Kernel Average Misorientation value (KAM value) was obtained. For each target, the KAM values were measured at five cross sections as shown in FIG. 1, and the average value thereof was determined. The results are shown in Table 1.

(Average Value of Orientation Area Ratios of {100} Plane)

The tantalum sputtering target of each test example obtained by the above producing method was cut in a direction perpendicular to the sputtering surface, and its cross section was polished with abrasive paper (corresponding to #2000) and further mirror-finished by means of buff polishing using POLIPLA solution. The resulting polished surface was treated with a mixed solution of hydrofluoric acid, nitric acid and hydrochloric acid to reveal a structure of a cross section perpendicular to the sputtering surface. The cross section perpendicular to the sputtering surface (width direction: 2 mm, thickness direction: overall thickness) was then observed under the measurement conditions as described above using an EBSP apparatus (JSM-7001FT-TLS type field emission electron microscope/crystal orientation analyzing apparatus OIM 6.0-CCD/BS), and the orientation area ratio of the {100} plane oriented at a misorientation of within 15° relative to the normal direction of the sputtering surface was determined. For each target, the orientation area ratios of the {100} plane were measured at the five cross sections shown in FIG. 1, and the average value thereof was determined. The results are shown in Table 1.

(Average Value of Aspect Ratios of Crystal Grains)

The tantalum sputtering target of each test example obtained by the above producing method was cut in a direction perpendicular to the sputtering surface, and its cross section was polished with abrasive paper (corresponding to #2000) and further mirror-finished by means of buff polishing using POLIPLA solution. The resulting polished surface was treated with a mixed solution of hydrofluoric acid, nitric acid and hydrochloric acid to reveal a structure of a cross section perpendicular to the sputtering surface. The cross section perpendicular to the sputtering surface was then observed under the measurement conditions as described above with an optical microscope apparatus (model ECLIPSE MA 200 manufactured by Nikon Corporation), and the aspect ratios of 20 crystal grains were measured, and the average value thereof was determined. The results are shown in Table 1.

(Sputtering Test)

Sputtering was then carried out using the sputtering target according to each test example to evaluate film thickness uniformity of the resulting sputtered film. The film thickness uniformity was evaluated by using "an average value" of film thickness variations (standard deviation/average value×100) for each target life (for each wafer). The target life can be expressed by integration of a power during sputtering and a total sputtering time. For example, a target life when carrying out sputtering at an electric power of 15 kW for 100 hours is 1500 kWh.

For a specific evaluation, sputtering with a target life of 300 kWh (at an electric power of 300 kW for 1 hour) was carried out seven times for each of the sputtering targets by using a magnetron sputtering apparatus (Endura) manufactured by Applied Materials, Inc. to form films on the total seven disc-shaped Si wafers with a thermal oxide film. Then, in-plane sheet resistances of each wafer at 49 positions as shown in FIG. 2 were measured with an Omni-map RS-100 apparatus manufactured by KLA Co., Ltd., and each value was converted into a film thickness (resistivity of tantalum was assumed to be 180 μΩcm), and the standard deviation and the average value of the film thickness were determined. The in-plane film thickness variation (%)=standard deviation/average value×100 was calculated for each wafer, and the average value of the "film thickness variation" calculated for each wafer was determined to be film thickness uniformity. The results are shown in Table 1.

TABLE 1

| No. | Final Cold Rolling Overall Rolling Reduction (%) | Final Cold Rolling One Pass Rolling Reduction (%) | Vickers Hardness (Hv) | KAM Value (°) | {100} Orientation Area Ratio (%) | Crystal Grain Aspect Ratio | Film Thickness Uniformity (%) |
|---|---|---|---|---|---|---|---|
| 1 | — | — | 83.0 | 0.40 | 28.3 | 1.0 | 2.5 |
| 2 | 35 | 2.5 | 115.0 | 3.90 | 43 | 3.5 | 3.8 |
| 3 | 35 | 2.5 | 110.0 | 3.37 | 42.0 | 3.0 | 3.4 |
| 4 | 10 | 2.5 | 95.0 | 1.00 | 32.5 | 2.5 | 2.3 |
| 5 | 10 | 2.5 | 90.0 | 1.00 | 32.5 | 2.3 | 2.2 |
| 6 | 20 | 2.5 | 100.0 | 1.92 | 34.8 | 2.8 | 2.0 |
| 7 | 22 | 2.5 | 105.0 | 2.40 | 39.0 | 3.0 | 1.9 |

DISCUSSION

It can be seen that the film thickness uniformity of the tantalum sputtering targets of Test Nos. 4 to 7 was improved as compared with that of the tantalum sputtering targets of Test Nos. 1 to 3. This is because in Test Nos. 4 to 7, all of the Vickers hardness, the KAM value and the orientation area ratio of the {100} plane were controlled to the appropriate values. Among test Nos. 4 to 7, Test Nos. 6 and 7 each having optimized aspect ratio of the crystal grain had significantly improved film thickness uniformity.

What is claimed is:

1. A tantalum sputtering target formed by a final cold rolling step and having a purity of 99.99% by mass or more, such that a total value of Na, Al, Si, K, Ti, Cr, Mn, Fe, Co, Ni, Cu, Zn and Zr is 100 ppm by mass or less when a compositional analysis is conducted by means of a glow discharge mass spectrometry (GDMS) and an average value of Vickers hardness on a sputtering surface of from 90 to 115 Hv, the tantalum sputtering target satisfying all of the following conditions (1) to (3):

(1) when a cross section perpendicular to the sputtering surface is measured by EBSP, an average value of Kernel Average Misorientation values (KAM values) is from 1.0° to 3.9°;

(2) when the cross section perpendicular to the sputtering surface is measured by EBSP, an average value of orientation area ratios of a {100} plane oriented at a misorientation of within 15° relative to a normal direction of the sputtering surface is from 32.5% to 43.0%; and (3) the tantalum sputtering target has an average value of aspect ratios of crystal grains from 2.3 to 3.5, as observed in the cross section perpendicular to the sputtering surface.

2. The tantalum sputtering target according to claim 1, wherein the average value of the KAM values is from 1.0° to 2.4°.

3. The tantalum sputtering target according to claim 1, wherein the average value of Vickers hardness on the sputtering surface is from 90 to 105 Hv.

4. The tantalum sputtering target according to claim 1, wherein the tantalum sputtering target has the average value of aspect ratios of crystal grains of from 2.3 to 3.0, as observed in the cross section perpendicular to the sputtering surface.

5. The tantalum sputtering target of claim 1, wherein the average value of orientation area ratios of the {100} plane oriented at the misorientation of within 15° relative to the normal direction of the sputtering surface is from 32.5% to 39.0%.

6. A method for forming a film comprising sputtering the tantalum sputtering target according to claim 1.

* * * * *